United States Patent
Takken et al.

(10) Patent No.: US 11,243,034 B2
(45) Date of Patent: Feb. 8, 2022

(54) INJECTION-MOLDED FLEXIBLE COLD PLATE

(71) Applicant: International Business Machines Corporation, Armonk, NY (US)

(72) Inventors: Todd E. Takken, Brewster, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/926,662

(22) Filed: Jul. 11, 2020

(65) Prior Publication Data

US 2020/0340762 A1   Oct. 29, 2020

Related U.S. Application Data

(62) Division of application No. 15/859,282, filed on Dec. 29, 2017, now Pat. No. 10,712,102.

(51) Int. Cl.
| | |
|---|---|
| *F28F 3/04* | (2006.01) |
| *H05K 7/20* | (2006.01) |
| *G06F 1/20* | (2006.01) |

(52) U.S. Cl.
CPC ........... *F28F 3/04* (2013.01); *H05K 7/20254* (2013.01); *F28F 2255/02* (2013.01); *G06F 1/20* (2013.01)

(58) Field of Classification Search
CPC combination set(s) only.
See application file for complete search history.

(56) References Cited

U.S. PATENT DOCUMENTS

| | | |
|---|---|---|
| 5,150,274 A | 9/1992 | Okada et al. |
| 5,168,348 A | 12/1992 | Chu et al. |
| 5,201,866 A | 4/1993 | Mok |
| 5,453,911 A | 9/1995 | Wolgemuth et al. |
| 5,920,457 A | 7/1999 | Lamb et al. |
| 6,400,012 B1 * | 6/2002 | Miller ............. H01L 23/473 257/712 |

(Continued)

OTHER PUBLICATIONS

Shurong Tian et al., unpublished U.S. Appl. No. 16/391,233, filed Apr. 22, 2019, Cold Plate With Flex Regions Between Fin Areas, pp. 1-17 plus 11 sheets of drawings.

(Continued)

*Primary Examiner* — Devon Russell
(74) *Attorney, Agent, or Firm* — Daniel Morris; Otterstedt, Wallace & Kammer, LLP

(57) ABSTRACT

A cold plate structure, wherein a thermally active region includes fins metal injection molded in a single piece with a fin base sufficiently thin so that the active region mechanically conforms to the heat generating device that the cold plate cools. The fin base is formed as a common structure with a bottom wall of the cold plate, reducing thermal resistance between the device and the fins and also enhancing mechanical flexibility. Another cold plate structure can include multiple thermally active regions, with flexible outer walls and a reduced thickness between active regions, allowing for position variation between multiple heat generation devices that are cooled by the common cold plate. A common base having multiple physically separate active regions can be metal injection molded in a single step, or bases of multiple active regions can be formed individually and joined later to form a common single cold plate structure.

3 Claims, 8 Drawing Sheets

(56) References Cited

U.S. PATENT DOCUMENTS

| | | | |
|---|---|---|---|
| 6,411,512 B1 | 6/2002 | Mankaruse et al. | |
| 6,504,720 B2 | 1/2003 | Furuya | |
| 6,549,411 B1* | 4/2003 | Herbert | H01L 23/367 |
| | | | 257/E23.102 |
| 6,982,877 B2 | 1/2006 | Vinson et al. | |
| 7,385,821 B1 | 6/2008 | Feierbach | |
| 7,547,582 B2* | 6/2009 | Brunschwiler | H01L 23/433 |
| | | | 438/123 |
| 8,069,907 B2* | 12/2011 | Bryant | F28D 15/04 |
| | | | 165/46 |
| 8,259,451 B2 | 9/2012 | Stanley et al. | |
| 8,736,048 B2 | 5/2014 | Schultz | |
| 9,213,378 B2 | 12/2015 | Anderl et al. | |
| 9,425,124 B2 | 8/2016 | Karidis et al. | |
| 9,570,373 B1 | 2/2017 | Schultz et al. | |
| 9,894,801 B1 | 2/2018 | Marroquin et al. | |
| 10,222,125 B2 | 3/2019 | Coteus et al. | |
| 10,712,102 B2 | 7/2020 | Takken et al. | |
| 2003/0017051 A1 | 1/2003 | Coutandin et al. | |
| 2008/0237847 A1 | 10/2008 | Nakanishi et al. | |
| 2009/0151907 A1 | 6/2009 | Karidis et al. | |
| 2011/0266897 A1 | 11/2011 | Le Besnerais | |
| 2012/0082880 A1* | 4/2012 | Koetting | H01M 10/647 |
| | | | 429/120 |
| 2013/0214406 A1* | 8/2013 | Schultz | H01L 25/0655 |
| | | | 257/713 |
| 2014/0162107 A1 | 6/2014 | Obrist et al. | |
| 2014/0299295 A1 | 10/2014 | Kalbacher et al. | |
| 2015/0369545 A1* | 12/2015 | Naritomi | F28F 3/12 |
| | | | 165/76 |
| 2016/0056088 A1 | 2/2016 | Uhlemann et al. | |
| 2016/0084589 A1 | 3/2016 | Sunder et al. | |
| 2016/0091260 A1 | 3/2016 | Schultz | |
| 2016/0290728 A1* | 10/2016 | Coteus | H01L 23/473 |
| 2016/0338231 A1* | 11/2016 | Prado | F28F 13/06 |
| 2016/0376744 A1 | 12/2016 | Lv et al. | |
| 2018/0027696 A1 | 1/2018 | Franz et al. | |
| 2018/0124949 A1 | 5/2018 | Marroquin et al. | |
| 2018/0263137 A1 | 9/2018 | Jensen et al. | |
| 2019/0096785 A1 | 3/2019 | Walczyk et al. | |

OTHER PUBLICATIONS

Paul J. Otterstedt, List of IBM Patents or Patent Applications Treated as Related, Jul. 17, 2020, pp. 1-2.

* cited by examiner

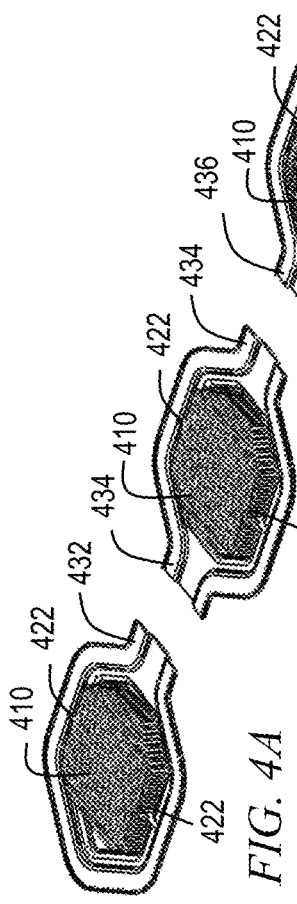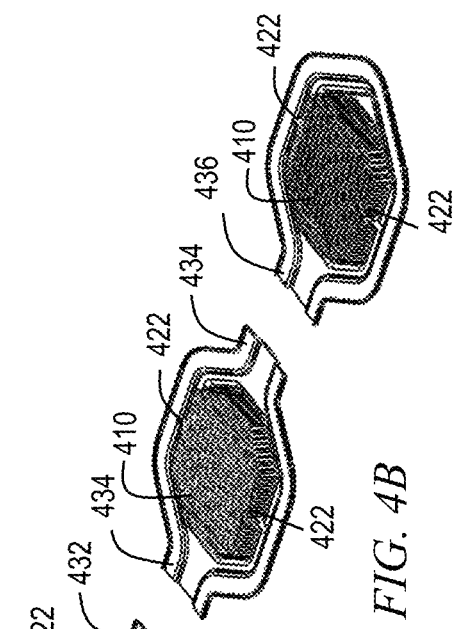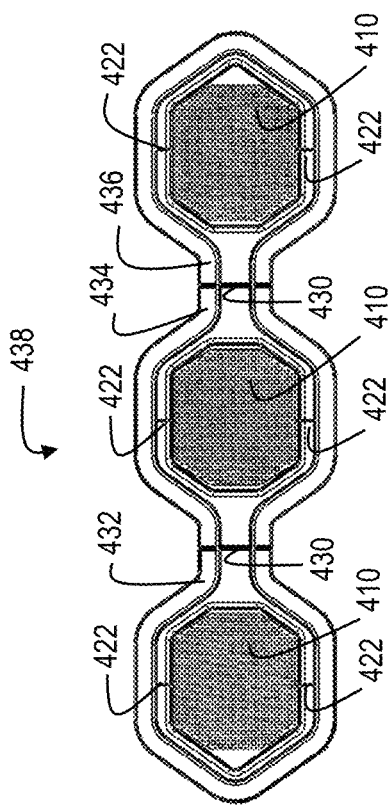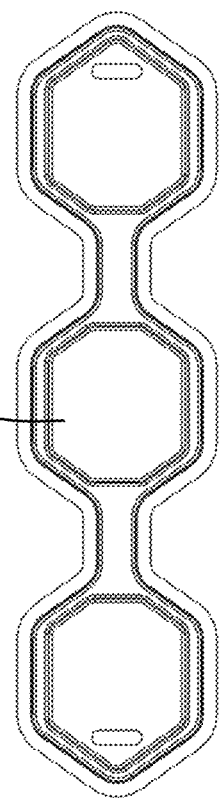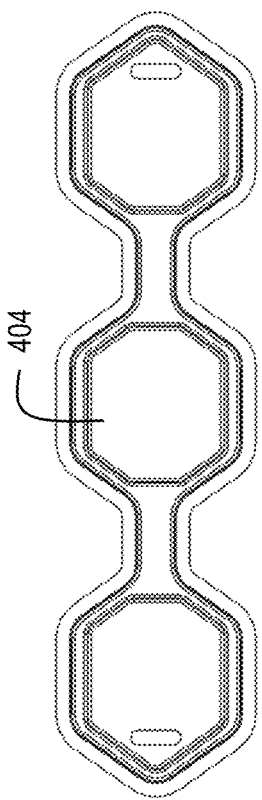

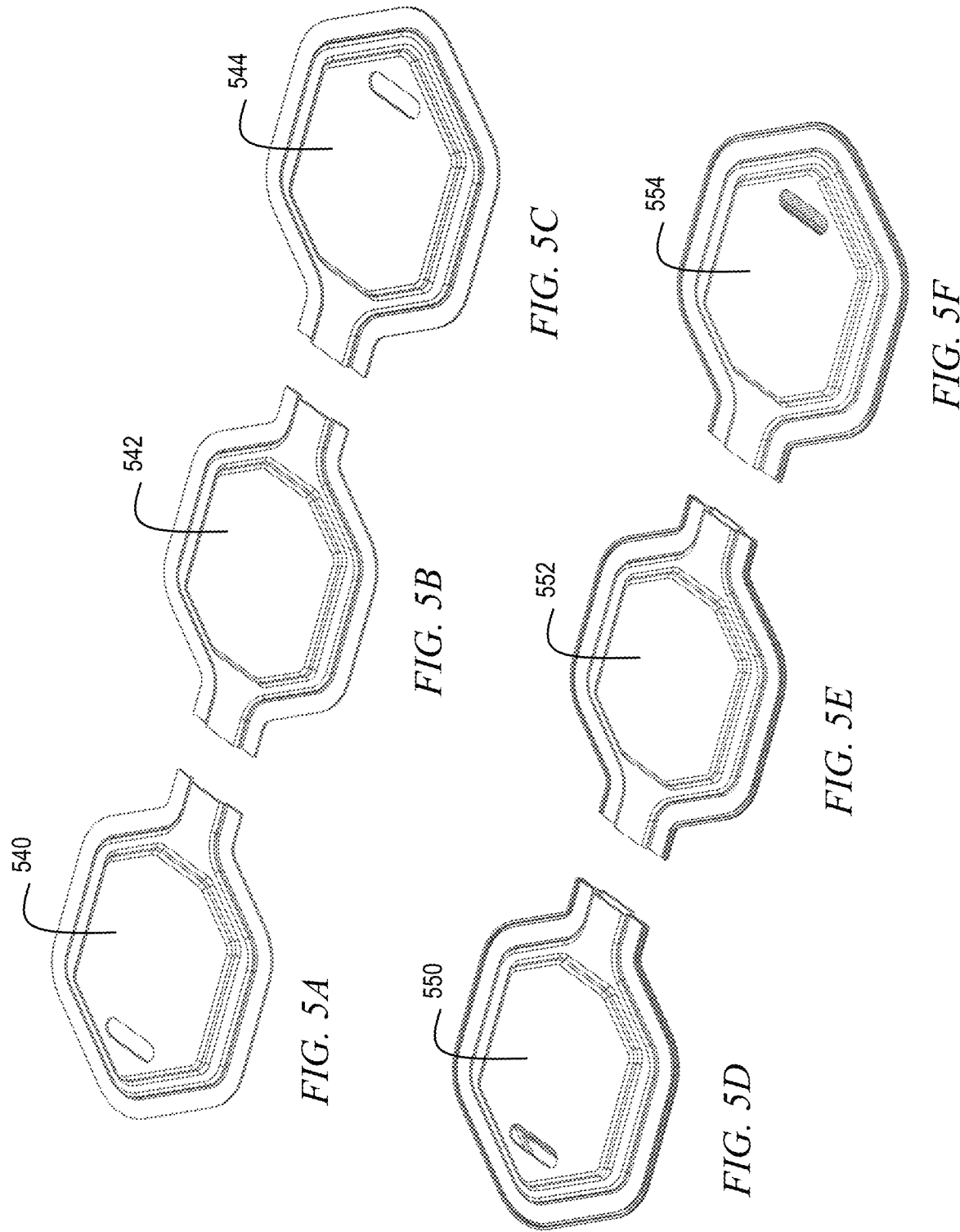

INJECTION-MOLDED FLEXIBLE COLD PLATE

CROSS-REFERENCE TO RELATED APPLICATIONS

This patent application is a divisional of U.S. patent application Ser. No. 15/859,282 filed Dec. 29, 2017, entitled "INJECTION-MOLDED FLEXIBLE COLD PLATE," the complete disclosure of which is expressly incorporated herein by reference in its entirety for all purposes.

BACKGROUND

The present invention generally relates to cold plates, water-cooled cold plates, and methods for manufacturing and assembling cold plates.

Computing systems with the highest power densities are typically water-cooled. Water has a high heat capacity and can remove heat more effectively than air. Water cooled computing systems typically use a cold plate placed in thermal contact with a computing chip or other heat generating device through a thermal interface material (TIM) layer. The cold plate is often a copper structure, through which water is made to flow. A thermally active region or "fin pack" is constructed with thermally conductive fins attached to a base, and the base is inserted between top and bottom outer wall structures, in order to form the entire cold plate. For the most effective heat removal, the cold plate and TIM are put in direct contact with the silicon die that forms the computing chip, in a method referred to as bare die attach. Heat is conducted from the chip through the TIM through the bottom wall of the cold plate, into the base and fins and from the fins into the water which flows past the fins inside the cold plate. Heat is removed as the water flows through and out of the cold plate.

Current cold plates are typically manufactured using multiple forming and/or machining steps. The advent of injection molding technologies for copper and other metals could significantly reduce the costs associated with making cold plate structures.

SUMMARY

A cold plate structure is formed by metal injection molding. A thermally active region of the cold plate comprises fins formed in a common structure with a fin base, and the fin base is made sufficiently thin that the active region is able to mechanically conform to a shape of a heat-producing component with which the cold plate is put in contact. When the active region of the cold plate conforms to the shape of the heat-producing component or die, a thermal interface material (TIM) between the cold plate and the die can be made thinner and less thermally resistive.

In one embodiment the base of the active region is formed as a common structure with the outer wall of the cold plate, replacing a thicker and stiffer stacked structure of active region base, brazing material and bottom outer wall, thereby resulting in lower thermal resistance between the bottom of the cold plate and the fins and also resulting in yet better mechanical flexibility and ability of the cold plate to conform to the shape of the chip.

In another embodiment multiple thin base, injection molded active regions are manufactured as part of a common cold plate structure, where the outer walls of the cold plate between active regions are thin and provide mechanical flexibility to account for position variation between the heat generation devices to which the multiple active regions are contacted. One such cold plate can therefore cool multiple heat generating devices. The multiple, physically separate active regions can be formed with a common base in a single metal injection molding step, or the bases of multiple active regions can be formed individually and joined later to form a common single cold plate structure with multiple active regions.

Thus, according to an exemplary embodiment, a cold plate structure includes a first thermally active region comprising a first plurality of fins formed as a unitary structure with a first fin base, and a bottom wall surrounding the first thermally active region and formed as a unitary structure with the first fin base. The first fin base is locally flexible to mechanically conform to the topology of a second structure against which the first thermally active region makes contact. The thickness of the bottom wall surrounding the first thermally active region may be different than the thickness of the first fin base, in order to optimize flexibility and pressure tolerance as a function of position.

According to an exemplary embodiment, a cold plate structure includes a first fin base and a first plurality of fins formed as a unitary structure and defining a first thermally active region, a second fin base and a second plurality of fins formed as a unitary structure and defining a second thermally active region, a bottom wall surrounding the first and second thermally active regions and formed as a unitary structure with the first and second fin bases, and a top wall attached at a periphery of the bottom wall to enclose the first thermally active region, the second thermally active region, and a plenum connecting the first and second thermally active regions in fluid communication with each other. The first fin base is locally flexible to mechanically conform to the topology of a second structure against which the first thermally active region makes contact. The second fin base also is locally flexible to mechanically conform to the topology of a third structure against which the second thermally active region makes contact. Since the flexibility of a beam is proportional to the cube of the beam thickness, decreasing the overall structure thickness in the plenum region will provide a significant increase in global vertical flexibility between active regions. A height of the plenum between the top and bottom walls is therefore less than a height of the first thermally active region between the top and bottom walls, such that the cold plate structure is globally flexible at the plenum. The thickness of the top and bottom walls may also be reduced in the region of the plenum, in order to further enhance this global flexibility between active regions.

According to another aspect, an exemplary method for making a locally and globally flexible cold plate with multiple thermally active regions includes metal injection molding as a unitary structure a first plurality of fins protruding from a first fin base to define a first thermally active region, and a bottom wall surrounding the first thermally active region, the bottom wall having a horizontal flange at its periphery. The method further includes attaching a top wall at the periphery of the bottom wall to enclose the first thermally active region and a plenum extending away from the first thermally active region, the top wall having a horizontal flange complementary to the horizontal flange of the bottom wall. A height of the plenum between the top and bottom walls is less than a height of the first and second thermally active regions between the top and bottom walls.

In view of the foregoing, techniques of the present invention can provide substantial beneficial technical effects. For example, one or more embodiments provide one or more of:

Enhanced conformance of a cold plate to an underlying die, enabling reduced thickness of a thermal interface material interposed between the cold plate and the die.

Enhanced conformance of a cold plate with multiple thermally active regions to multiple dies with vertical positional tolerances creating offsets therebetween from the nominal vertical relative positions of said thermally active regions.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 4A-4F depict a method for fabricating an injection molded cold plate with multiple active areas, formed by joining three separate cold plate bottom structures each having a single active area, according to an exemplary embodiment; and FIGS. 5A-5H depict another method for fabricating a cold plate structure having multiple active regions, according to an exemplary embodiment.

DETAILED DESCRIPTION

Currently available and proposed injection molded cold plates have significant thermal performance limitations related to a lack of flexibility in the cold plate designs. Following on the traditional methods for designing cold plates prior to the advent of injection molding technology, current injection molded cold plates use the injection molding technology primarily to make a fin pack structures at lower cost. Innovations are added to make fin shapes which are thinner or of more thermally effective shapes that what can be made without injection molded technology. However, several traditional features have remained in today's injection molded cold plates, and these features are performance limiting and do not achieve minimal cost.

The first traditional limiting feature is that current injection molded cold plates retain the thick base of traditional cold plate fin packs. This limits the flexibility of the fin pack and makes the fin pack less able to mechanically conform to the shape of the die from which it is supposed to remove heat. If the surface of the die is not flat, either due to the die manufacturing process, the die-to-substrate assembly process or to warping during thermal expansion and contraction, then the thermal interface material between the die and the cold plate with have to be thicker and more thermally resistive, in order to avoid forming very thermally resistive air gaps.

Another limiting feature is that in the current injection molded cold plates the fin pack and the bottom wall of the cold plate still are formed as separate pieces of metal. This means that the injection molded fin pack is attached through a brazing or other attachment process to the bottom plate of the cold plate. This attachment joint will add thermal resistance, and makes the fin pack too stiff to be "locally flexible" as discussed herein.

Another limiting feature of current injection molded cold plates is that multiple fin packs or active regions are not combined into a common flexible cold plate structure. Instead, brazed or welded joints are provided between adjoining fin packs, which makes the overall structure too stiff to be "globally flexible" as discussed herein.

Figure 1:
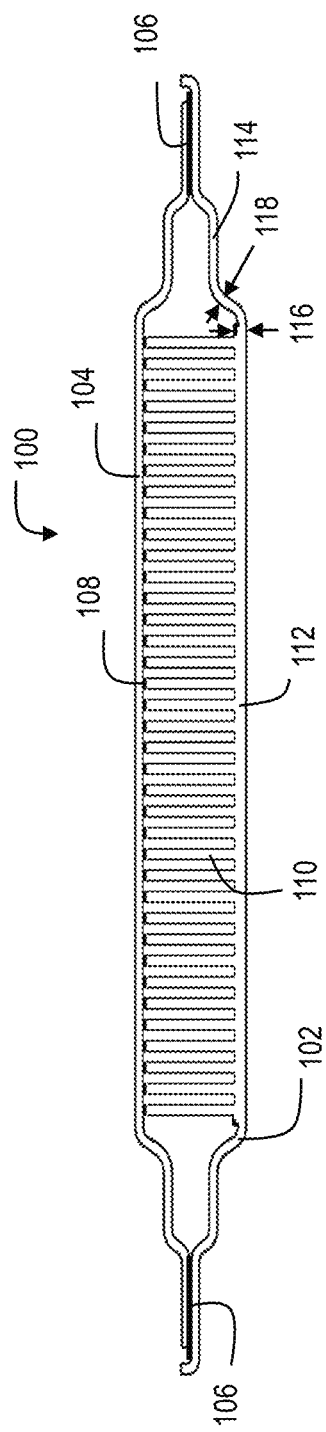
FIG. 1 depicts a cross sectional view of a single active area of a cold plate, where fins, a fin base, and a cold plate bottom wall are formed as a single structure in a common injection molding process, according to an exemplary embodiment.

FIG. 1 shows a cross sectional view of a first thermally active region of a cold plate 100. The first thermally active region includes fins 110, a fin base 112, and a bottom wall 114 that all are formed together as a single structure 102 during a metal injection molding process. An advantage of using metal injection molding is that, unlike conventional constructions in which the fins would be brazed onto a sheet metal fin base and cold plate bottom wall, the thickness 116 of the combined fin base 112 and bottom wall 114 can be the same as or even less than the thickness 118 of the cold plate bottom wall 114 outside the region of the fin base. For example, using copper in the metal injection molding process, the fin base 112 can be manufactured with a thickness of about 0.6 millimeters (mm) whereas the cold plate bottom wall 114 that surrounds the fin base 112 can be manufactured with a thickness of about 0.3-1.0 mm. Other exemplary materials and thicknesses will be apparent to the skilled worker. In this manner the metal injection molding process allows independent optimization of the flexibility of the first thermally active region and regions adjacent to/surrounding the first thermally active region. For example, the fin base 112 can be made flexible to conform to the upper surface of a silicon die or other heat-producing structure, while the cold plate bottom wall 114 can be made more or less flexible than the fin base 112 in order to bridge across a gap between heat-producing structures and potentially conform to vertical variation in the assembled positions of relevant surfaces of the heat-producing structures, i.e. displacements in a direction perpendicular to the widest surfaces of the top and bottom walls 104, 114.

The cross section shown in FIG. 1 is of a completed cold plate that includes a top wall 104, which is brazed or otherwise fused to the tops of the fins 110 at junctions 108 and is further brazed or fused to the cold plate's bottom wall 102 at junction (horizontal flange) 106. Note that the top wall 104 may be made relatively rigid, or may be made relatively flexible, as the fin base 112 or as the bottom wall 114.

At this juncture it will be helpful to define by example the terms "rigid" and "flexible". These terms have special significance locally, i.e. when discussing conformance of a thermally active region to a silicon die, and globally, i.e. when discussing the conformance of a cold plate having multiple thermally active regions to different positions of multiple silicon dies.

Regarding local rigidity and flexibility, an exemplary conventional cold plate may have a fin base about 1.0 mm thick that is brazed onto a separate bottom wall about 0.5 mm thick. To deform the bottom wall and fin base by about 0.1 mm to conform to an irregularity in the upper surface of a silicon die to which the cold plate should mate, a pressure of about 250 pounds per square inch (psi) needs to be applied to press the cold plate against the silicon die. This pressure typically would crack the die. Accordingly, conventional cold plate designs are considered to be locally "rigid" in that it is not feasible to conform the cold plate bottom wall and fin base to any irregularity of an underlying silicon die. Instead, a conformable thermal interface material (TIM) is used to fill any gaps between the cold plate and the die. The conformable TIM being of sufficient thickness to fill in gaps and be squeezed in tight regions, introduces significant thermal resistance between the die and the cold plate. Thus, it would be desirable to provide a flexible cold plate that would not require a conformable TIM.

By contrast, a locally flexible cold plate, according to an exemplary embodiment, has a fin base that is about 0.6 mm thick and that also serves as the bottom wall of the cold plate. It is possible to do this because the fins can be metal injection molded in one piece with the fin base/bottom wall. Another advantageous feature of metal injection molding the fin base and fins as a unitary structure is that a "pin fin" arrangement can be provided in place of conventional elongated fins, which need to be brazed onto a fin base in a manner not suitable for pins. The pin fins (as shown, for example, in FIGS. 4A-4F) are efficient for heat transfer and provide a more flexible internal structure that does not significantly resist deformation of the fin base. Accordingly, to deform the fin base/bottom wall by about 0.1 mm, only about 49 psi needs to be applied to press the cold plate against the silicon die. This pressure typically would not crack the die. Accordingly, a cold plate according to the exemplary embodiment is considered to be "flexible" in that it is feasible to conform the cold plate fin base/bottom wall to irregularities of an underlying silicon die. This means that a conformable TIM does not need to be provided between the cold plate and the die; instead, a relatively thin and non-compressible TIM can be used. This results in lower thermal resistance between the cold plate and the die.

Regarding global rigidity and flexibility, an exemplary conventional cold plate may have a bottom wall about 0.5 mm thick and has a plenum that extends between active regions to keep the active regions in fluid communication with each other. Typically, the height and wall thicknesses of the conventional cold plate in the plenum will be the same as in the active regions. This has the effect that the plenum exhibits global rigidity, i.e. for a 3 inch (in) by 0.87 in section of the plenum, with one end of the 3 in length constrained, a transverse force of about 3.9 pounds (lb.) is required at the free end in order to achieve 0.5 mm deflection of the free end.

By contrast, a globally flexible cold plate according to an exemplary embodiment has a plenum that is diminished in height and optionally also diminished in wall thickness by comparison to the active regions of the cold plate. (See, for example, FIGS. 2A-2D). Thus, for example, the plenum may have a height of only about 3.2 mm whereas the active region has a height of 6.75 mm. The result is that a 3 in by 0.87 in section of the globally flexible plenum deflects by 0.5 mm at the free end of the 3 in length when a transverse force of only about 0.37 lb. is applied with the other end constrained. This enables the globally flexible cold plate to conform to varying heights of adjacent heat-producing components as installed.

Figure 2A:
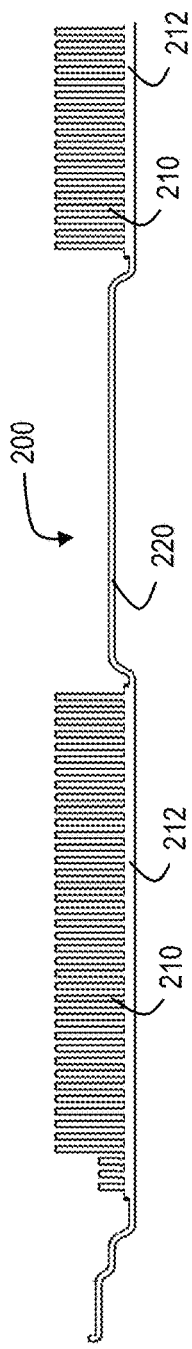
FIGS. 2A-2D depict an injection molded cold plate bottom structure having three active areas and flexible regions between the active areas, according to an exemplary embodiment.
Figure 2B:
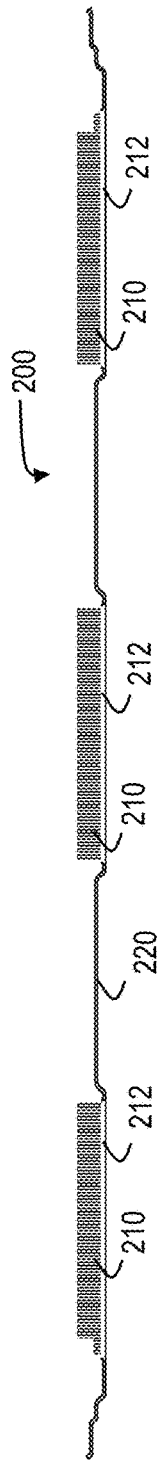
Figure 2D:
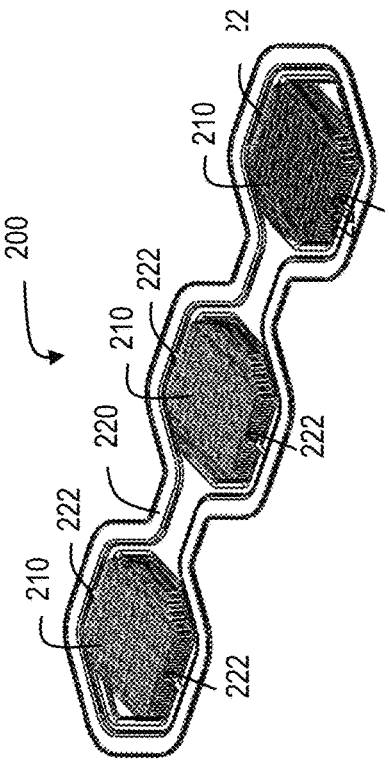
Figure 2C:
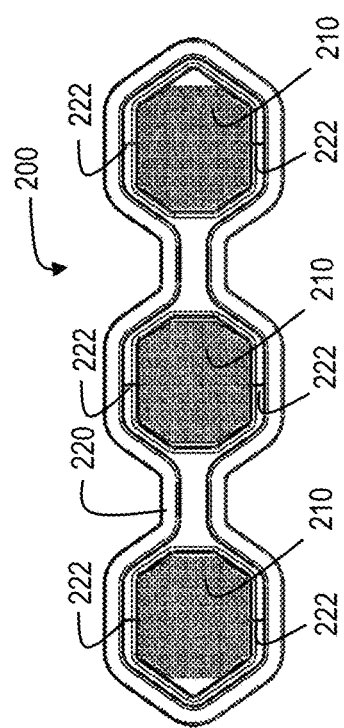

FIGS. 2A-2D show an integrated bottom wall structure, used in a cold plate 200 having three thermally active regions (fin packs). FIG. 2A is a detailed view which clarifies that a thermally active region, which includes fins 210 and fin base 212, is formed as part of a common structure with a flexible bottom wall 220 that spans the space between fin packs. FIG. 2B shows the same bottom wall common structure used in the entire length of a cold plate structure having three thermally active regions. FIGS. 2C and 2D show top and 3D perspectives on how the bottom wall 220 of the cold plate connects between the active thermally active regions. The small lateral size of fins 210 and the small thickness of fin pack base 212 are optimized to provide the best flexibility of the thermally active region to conform to the topology of the heat generating device to which the active region is being contacted. The section of the cold plate bottom wall 220 between active regions is of reduced thickness and reduced width relative to the fin base 212, which provides flexibility to adjust for global height differences between the separate devices to which each active region of the cold plate is making contact. Item 222 is a water blocker, to prevent water from bypassing the fins in the active region.

Compared to the design shown in FIGS. 2B-2D, the design could allow even greater global vertical flexibility between thermally active regions if system mechanical restrictions were to allow making the plenum regions wider (parallel to the widest surfaces of the top and bottom walls) and thinner (reduced height between the top and bottom walls). Since flexibility is roughly proportional to the first power of plenum width and the third power of plenum height, vertical flexibility would be enhanced if the plenum region were made wider and thinner.

Figure 3A:
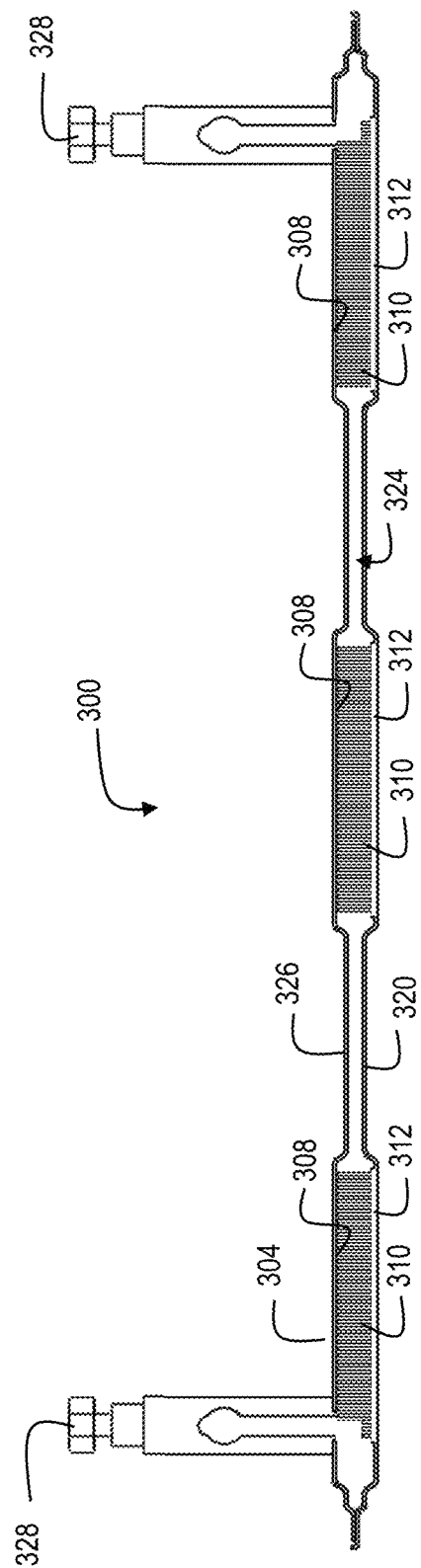
FIGS. 3A-3C depict a cold plate with added water inlet and outlet connections, according to an exemplary embodiment.
Figure 3B:
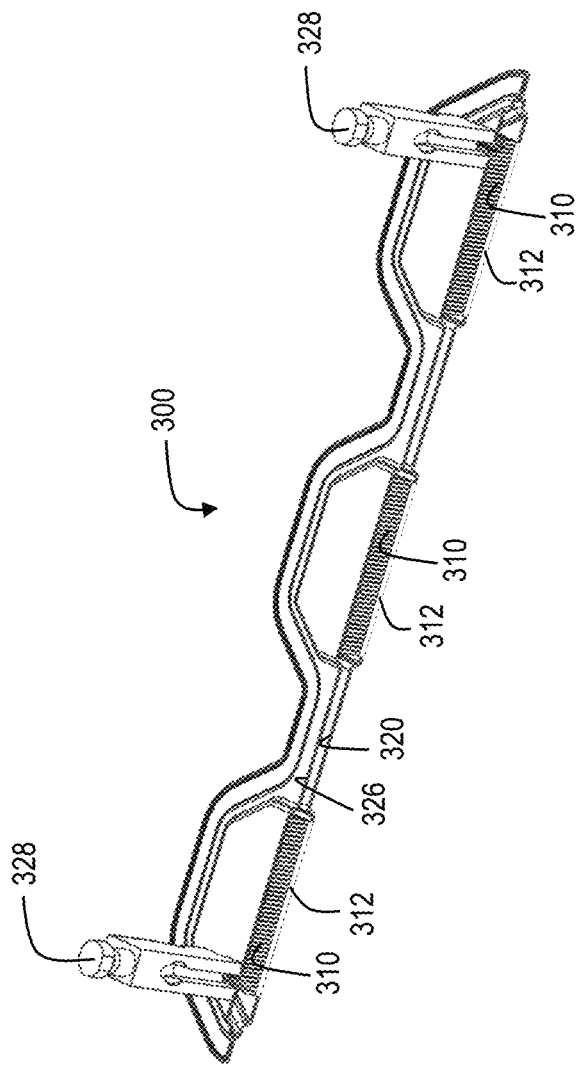
Figure 3C:
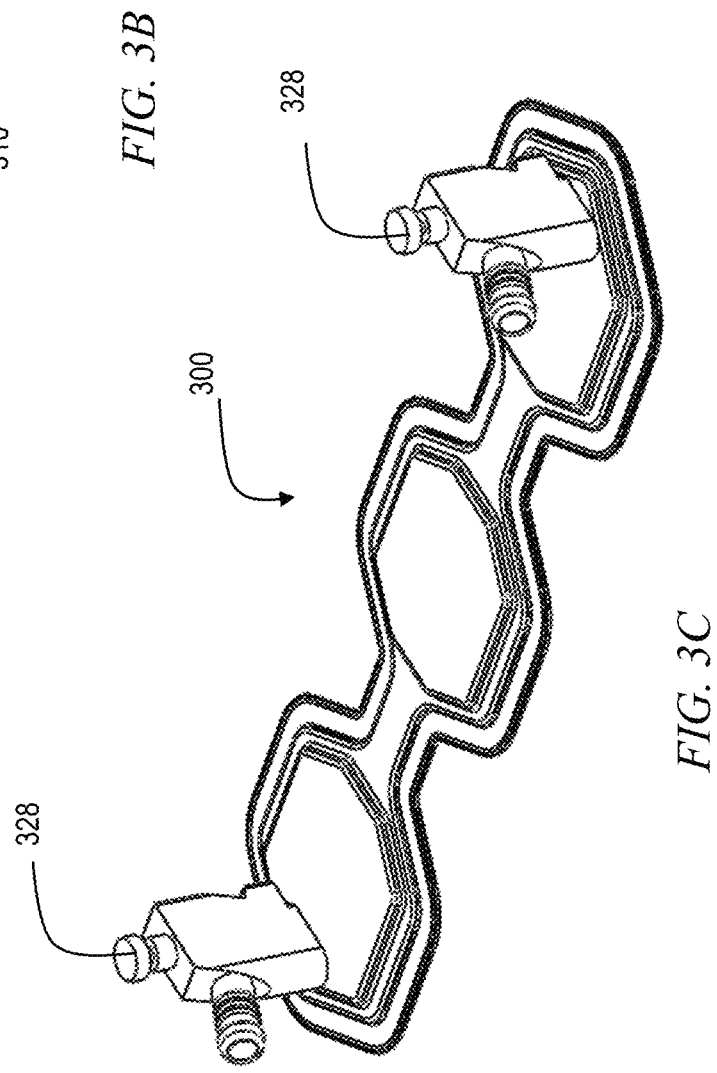

FIGS. 3A-3C show an entire cold plate 300 having top and bottom walls, three thermally active regions with intervening plena, and water inlet and outlet connections. FIG. 3A shows a cross sectional front view of the cold plate, with top wall 304 and bottom wall 312 in thermally active region and with top wall 326 and bottom wall 320 between thermally active regions. Thus, the top wall 326 and the bottom wall 320 define a plenum 324 that is of diminished height by contrast to the thermally active region, rendering the cold plate globally flexible as discussed briefly above. Water inlet and outlet structures 328 provide connections to hoses or pipes. FIGS. 3B and 3C show 3D views. FIG. 3B is a 3D cross sectional view of the cold plate, whereas FIG. 3C shows the entire cold plate 300 with no cross sectional cut. As in FIG. 1, fins 310 are brazed to the top wall 304 at joints 308 and are formed integrally with the bottom wall/fin base 312.

Figure 4F:
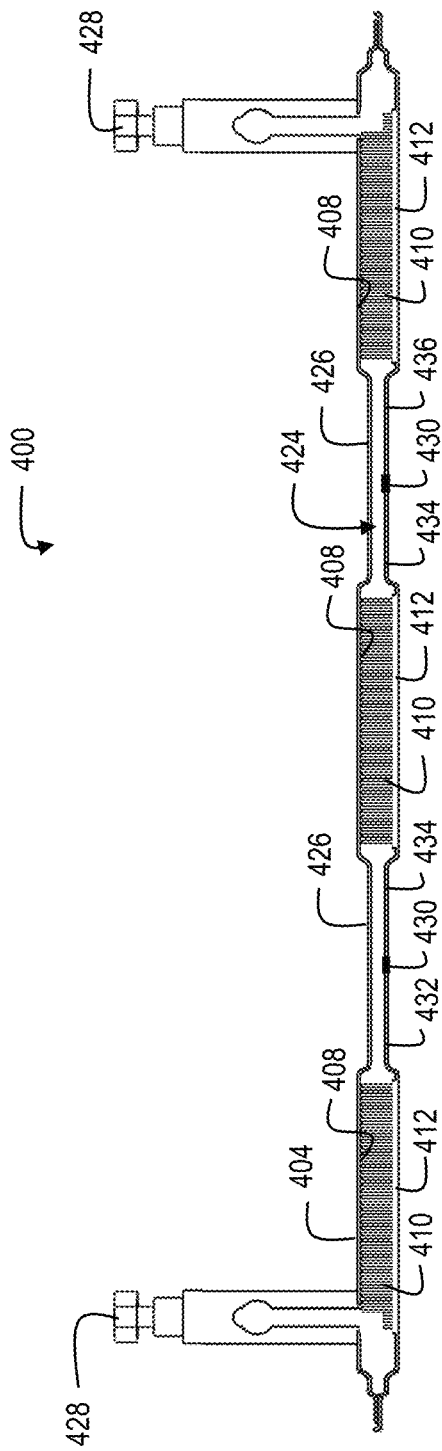

FIGS. 4A-4F describe an alternate method for fabricating a cold plate structure having multiple active regions. The bottom walls of each individual active region can be formed using separate metal injection molding processes. FIG. 4A shows a first active region bottom wall formed in a first injection molding process with pins 410 and its surrounding local region of bottom wall that surrounds and extends beyond the fin pack base. Element 422 is a water blocker, which prevents water from bypassing the active fin region. FIG. 4B shows a second thermally active region's bottom wall, and FIG. 4C shows a third active region's bottom wall. In each case the fin pack base 412 and the bottom wall 414 surrounding the fin region are formed in a common injection molding process. The fins 410 are integral with the fin pack base 412 and are brazed to the top wall 404 at junctions 408. Thus, for a cold plate with three thermally active regions, this technique would entail three separate injection molding processes to form the cold plate bottom wall structures shown in FIGS. 4A, 4B and 4C respectively. FIG. 4D shows the completed bottom wall 438 for the entire cold plate, formed by joining the bottom walls 432, 434, 436 of FIGS. 3A, 3B and 3C at joint locations 430. The joint 430 is usually formed by a brazing or other material that is less flexible than the regular bottom plate material such as copper, which becomes annealed during the overall assembly process. So, the embodiment in FIGS. 4A-4F gives up some flexibility. However, this may be an optimal design in cases where a particular metal injection molding process cannot handle the large aspect ratio required to form the entire bottom wall structure of a cold plate having multiple active regions. FIG. 4E shows the top wall 404 formed as a single structure. FIG. 4F shows a cross sectional view of a three active region cold plate 400, formed as a result of joining the bottom wall structure 438 of FIG. 4D with the top wall structure 404 of FIG. 4E. The top and bottom walls 404, 438 define plena 424 that connect the active regions of the cold plate 400. Notably, the plena 424 are of reduced height relative to the active regions defined by the top and bottom walls 404, 432, 434, 436. Water inlet and outlet structures 428 provide connections to hoses or pipes.

Figure 5G:
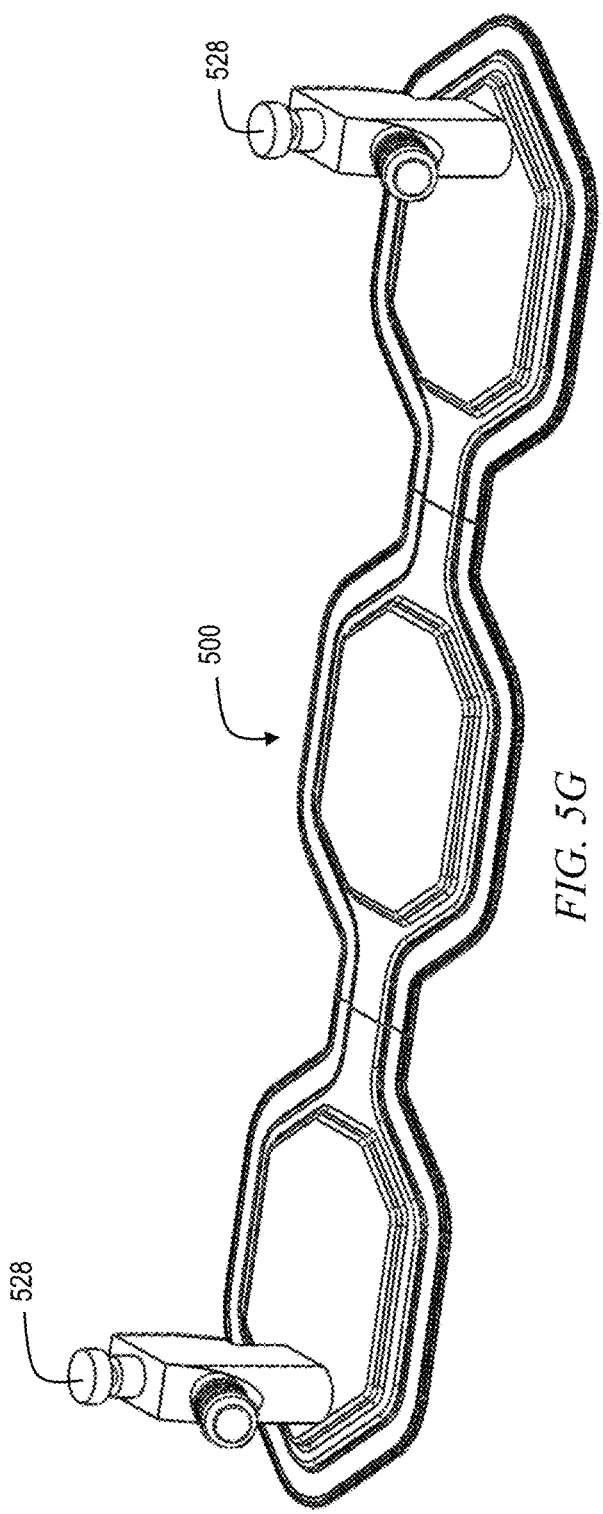
Figure 5H:
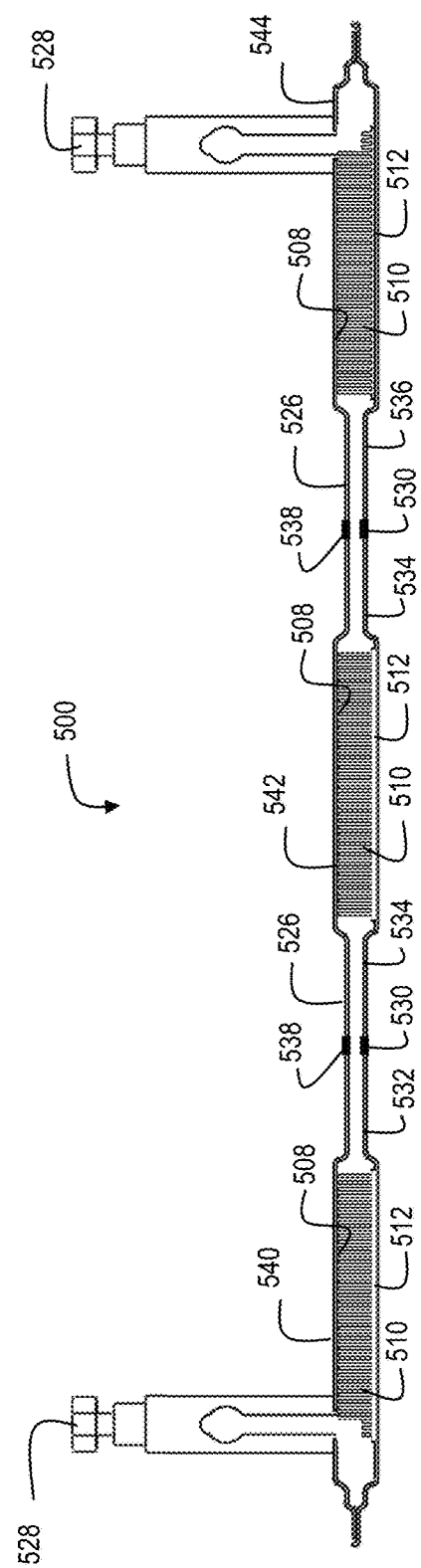

FIGS. 5A-5H depict another alternate method for fabricating a cold plate structure having multiple active regions. The bottom walls 532, 534, 536 of each individual active region can be formed using separate metal injection molding processes. The top wall sections 540, 542 and 544 related to each individual active region are also formed separately. Then the top and bottom wall sections for each active region are joined, thereby forming separate structures 550, 552 and 554 for each active region, with each structure having a top wall joined to a bottom wall. FIGS. 5A, 5B and 5C show separate top wall structures 540, 542 and 544. FIGS. 5D, 5E and 5F show single active region cold plate structures 550, 552 and 554, each formed from combining a single active region bottom wall structure with one of the top wall structures from FIGS. 5A-5C. FIG. 5G shows a 3D view of a completed three active region cold plate 500 formed by joining the individual active region cold plate structures 550, 552 and 554 of FIGS. 5D-5F. FIG. 5H shows a cross sectional view of this complete three active region cold plate 500 and indicates the joints 538 between the top wall sections and joints 530 between the bottom wall sections. The joints 530, 538 are formed in plenum regions 526 that connect the active regions 550, 552, 554. Notably, the plena 526 are of reduced height relative to the active regions 550, 552, 554. Water inlet and outlet structures 528 provide connections to hoses or pipes.

Given the preceding discussion, the ordinary skilled worker will appreciate that, according to an aspect of the invention, an exemplary cold plate structure includes a first thermally active region comprising a first plurality of fins formed as a unitary structure with a first fin base, and a bottom wall surrounding the first thermally active region and formed as a unitary structure with the first fin base. The first fin base is locally flexible to mechanically conform to the topology of a second structure against which the first thermally active region makes contact.

According to another aspect, an exemplary cold plate structure includes a first fin base and a first plurality of fins formed as a unitary structure and defining a first thermally active region, a second fin base and a second plurality of fins formed as a unitary structure and defining a second thermally active region, a bottom wall surrounding the first and second thermally active regions and formed as a unitary structure with the first and second fin bases, and a top wall attached at a periphery of the bottom wall to enclose the first thermally active region, the second thermally active region, and a plenum connecting the first and second thermally active regions in fluid communication with each other. The first fin base is locally flexible to mechanically conform to the topology of a second structure against which the first thermally active region makes contact. The second fin base also is locally flexible to mechanically conform to the topology of a third structure against which the second thermally active region makes contact. A height of the plenum between the top and bottom walls is less than a height of the first thermally active region between the top and bottom walls, such that the cold plate structure is globally flexible at the plenum.

According to another aspect, an exemplary method for making a locally and globally flexible cold plate with multiple thermally active regions includes metal injection molding as a unitary structure a first plurality of fins protruding from a first fin base to define a first thermally active region, and a bottom wall surrounding the first thermally active region, the bottom wall having a horizontal flange at its periphery. The method further includes attaching a top wall at the periphery of the bottom wall to enclose the first thermally active region and a plenum extending away from the first thermally active region, the top wall having a horizontal flange complementary to the horizontal flange of the bottom wall. A height of the plenum between the top and bottom walls is less than a height of the first and second thermally active regions between the top and bottom walls. In one or more embodiments, the method further includes metal injection molding as a unitary structure with the bottom wall a second plurality of fins protruding from a second fin base to define a second thermally active region surrounded by the bottom wall and connected with the plenum. In one or more embodiments, the method further includes metal injection molding the second thermally active region as a separate piece, then brazing the second thermally active region onto the plenum to form the cold plate structure having multiple thermally active regions.

Accordingly, in one or more embodiments, the second thermally active region can be vertically offset from the first thermally active region. Also, in one or more embodiments, a width of the plenum can be reduced relative to a width of the first thermally active region. In one or more embodiments, a thickness of the bottom wall at the plenum is less than a thickness of the first fin base at the first thermally active region. In one or more embodiments, the first plurality of fins are formed as pins protruding from the first fin base. In one or more embodiments, the cold plate structure is metal injection molded of copper and then annealed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for making a locally and globally flexible cold plate with multiple thermally active regions, comprising:

metal injection molding as a unitary structure a first plurality of fins protruding from a first fin base to define a first thermally active region, and a bottom wall surrounding the first thermally active region, the bottom wall having a horizontal flange at its periphery; and attaching a top wall at the periphery of the bottom wall to enclose the first thermally active region and a plenum extending away from the first thermally active region, the top wall having a horizontal flange complementary to the horizontal flange of the bottom wall;

wherein a height of the plenum between the top and bottom walls is less than a height of the first thermally active region between the top and bottom walls, wherein a thickness of the bottom wall at the plenum is different from a thickness of the first fin base at the first thermally active region.

2. The method of claim 1 wherein the first plurality of fins are formed as pins protruding from the first fin base.

3. The method of claim 1 further comprising metal injection molding as a unitary structure with the bottom wall a second plurality of fins protruding from a second fin base to define a second thermally active region surrounded by the bottom wall and connected with the plenum.

* * * * *